United States Patent
Tsai et al.

(10) Patent No.: US 10,711,348 B2
(45) Date of Patent: *Jul. 14, 2020

(54) APPARATUS TO IMPROVE SUBSTRATE TEMPERATURE UNIFORMITY

(71) Applicant: APPLIED MATERIALS, INC., Santa Clara, CA (US)

(72) Inventors: Cheng-Hsiung Tsai, Cupertino, CA (US); Youqun Dong, Santa Clara, CA (US); Manjunatha Koppa, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 1035 days.

This patent is subject to a terminal disclaimer.

(21) Appl. No.: 14/641,378

(22) Filed: Mar. 7, 2015

(65) Prior Publication Data

US 2016/0258061 A1 Sep. 8, 2016

(51) Int. Cl.
| | | |
|---|---|---|
| *C23C 16/458* | (2006.01) |
| *C23C 16/46* | (2006.01) |
| *C23C 16/455* | (2006.01) |
| *H01L 21/687* | (2006.01) |

(52) U.S. Cl.
CPC ...... *C23C 16/458* (2013.01); *C23C 16/45544* (2013.01); *C23C 16/46* (2013.01); *H01L 21/68742* (2013.01)

(58) Field of Classification Search
CPC ....................................................... H04J 1/00
See application file for complete search history.

(56) References Cited

U.S. PATENT DOCUMENTS

| | | | | |
|---|---|---|---|---|
| 5,879,128 A * | 3/1999 | Tietz | ................. | H01L 21/68742 414/757 |
| 6,069,095 A * | 5/2000 | Haider | .............. | H01L 21/67115 438/308 |
| 6,087,632 A * | 7/2000 | Mizosaki | .......... | H01L 21/67115 118/725 |
| 6,108,491 A * | 8/2000 | Anderson | ......... | H01L 21/67115 118/725 |
| 6,391,804 B1 * | 5/2002 | Grant | ................ | H01L 21/67109 438/308 |
| 6,435,798 B1 * | 8/2002 | Satoh | .................. | C23C 16/4586 118/728 |
| 7,255,772 B2 * | 8/2007 | Biberger | ........... | H01L 21/67051 118/715 |
| 7,927,425 B2 * | 4/2011 | Chiang | ............. | H01J 37/32431 118/712 |
| 9,816,183 B2 * | 11/2017 | Ashihara | ............ | C23C 16/45565 |
| 9,957,615 B2 * | 5/2018 | Tzu | .......................... | C23C 16/46 |

(Continued)

FOREIGN PATENT DOCUMENTS

WO   WO-2009008673 A2 *   1/2009   ........ H01L 21/67115

*Primary Examiner* — Charlee J. C. Bennett
(74) *Attorney, Agent, or Firm* — Moser Taboada; Alan Taboada

(57) ABSTRACT

Apparatus for improving substrate temperature uniformity in a substrate processing chamber are provided herein. In some embodiments, a cover plate for a substrate processing chamber includes: an outer portion; and a raised inner portion having a thermally emissive layer, wherein a thermal emissivity of the thermally emissive layer varies across the thermally emissive layer.

19 Claims, 3 Drawing Sheets

(56) References Cited

U.S. PATENT DOCUMENTS

| | | | |
|---|---|---|---|
| 2001/0013279 A1* | 8/2001 | Blalock | B29C 43/56 100/71 |
| 2004/0023504 A1* | 2/2004 | Yoo | H01L 21/67109 438/709 |
| 2005/0172905 A1* | 8/2005 | Kaszuba | C23C 16/4401 118/728 |
| 2008/0029248 A1* | 2/2008 | Magnant | B01L 7/00 165/104.19 |
| 2009/0156019 A1* | 6/2009 | Satoh | H01L 21/3105 438/798 |
| 2009/0176381 A1* | 7/2009 | Hiyama | G03F 7/427 438/795 |
| 2012/0040485 A1* | 2/2012 | Schramm | C23C 14/16 438/57 |
| 2012/0180726 A1* | 7/2012 | Han | C23C 16/4584 118/728 |
| 2012/0225566 A1* | 9/2012 | Hamano | C23C 16/46 438/765 |
| 2015/0075432 A1* | 3/2015 | Tzu | C23C 16/46 118/725 |
| 2016/0013079 A1* | 1/2016 | Choi | H01L 21/67248 156/345.21 |
| 2017/0221735 A1* | 8/2017 | Hung | C23C 16/46 |

* cited by examiner

APPARATUS TO IMPROVE SUBSTRATE TEMPERATURE UNIFORMITY

FIELD

Embodiments of the present disclosure generally relate to an apparatus for improving substrate temperature uniformity during substrate processing.

BACKGROUND

Atomic layer deposition (ALD) and chemical vapor deposition (CVD) are two exemplary methods used in semiconductor fabrication to deposit thin films on a substrate. ALD and CVD processes generally include introducing a process gas to a process chamber in which a substrate, such as a semiconductor substrate, is supported on a substrate support.

Heated ceramic substrate supports or plates have been found useful in at least ALD and CVD processing. However, the inventors have observed that the heater temperature can be non-uniform across the surface of the heater due to the configuration of the process chamber. For example, in some chamber configurations, the inventors have observed that the temperature can be non-uniform over the area of the heater that covers a pin lift hoop opening in the bottom of the chamber, and a slit valve opening in the side of the chamber that is used for loading and unloading substrates for processing.

Thus, the inventors have provided an apparatus and processing chamber for improving substrate temperature uniformity.

SUMMARY

Apparatus for improving substrate temperature uniformity in a substrate processing chamber are provided herein. In some embodiments, a cover plate for a substrate processing chamber includes: an outer portion; and a raised inner portion having a thermally emissive layer, wherein a thermal emissivity of the thermally emissive layer varies across the thermally emissive layer.

In some embodiments, a cover plate for a substrate processing chamber includes: an outer portion; a raised inner portion having a plurality of features; a central opening disposed through the cover plate; and one or more thermally emissive elements having a plurality of corresponding features to removably couple the one or more thermally emissive elements to the raised inner portion to form a thermally emissive layer about the central opening, wherein portions of the thermally emissive layer have different thermal emissivities.

In some embodiments, a substrate processing chamber includes: a substrate support having substrate receiving surface and a shaft to support the substrate receiving surface; and a cover plate disposed about the shaft of the substrate support beneath the substrate receiving surface and having a thermally emissive layer to reflect heat toward the substrate receiving surface, wherein a thermal emissivity of the thermally emissive layer varies across the thermally emissive layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
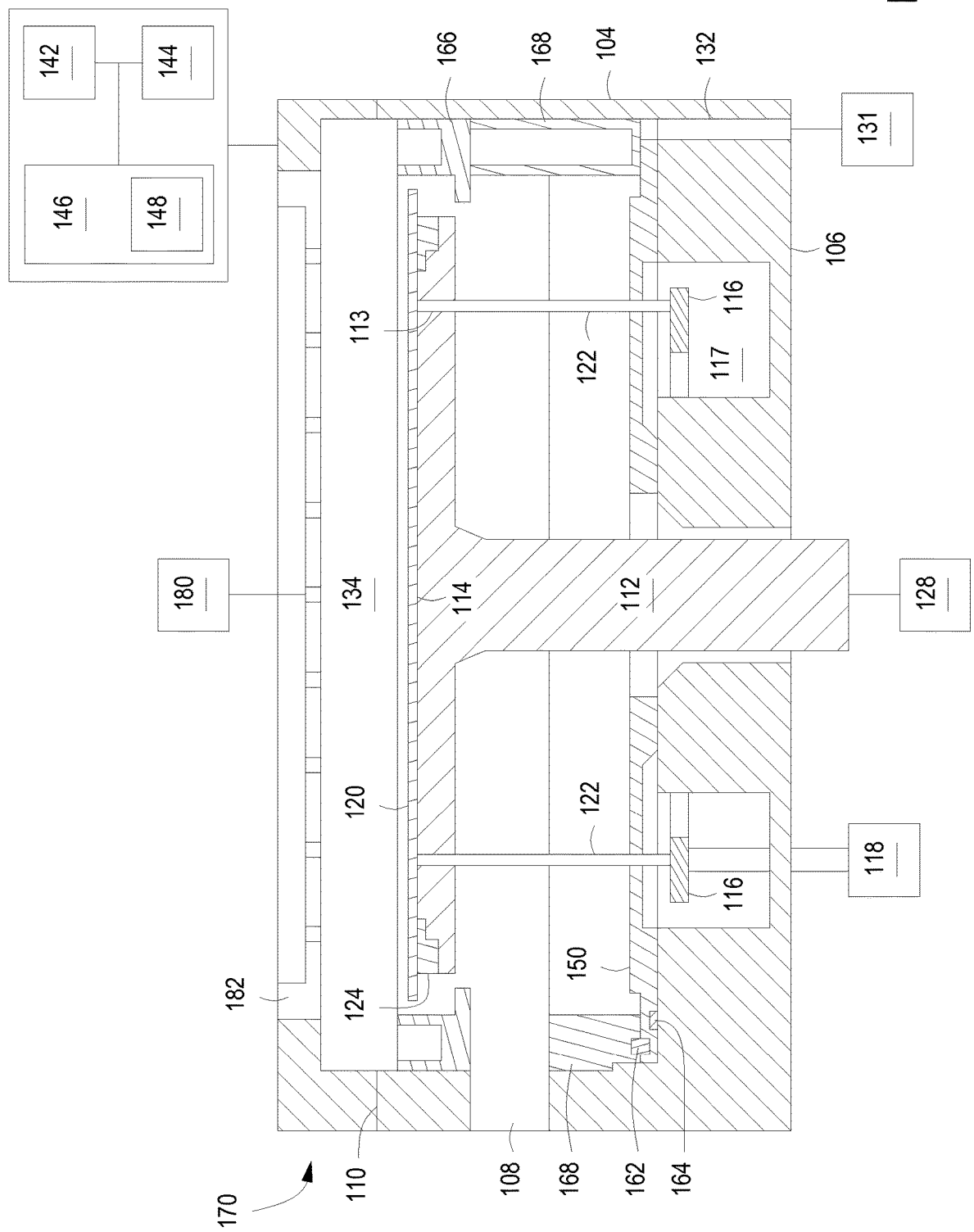
FIG. 1 depicts a schematic side view of a substrate processing system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure related to methods and apparatus for thermally processing substrates. Embodiments of the inventive apparatus may provide improved substrate temperature uniformity. Specifically, substrate temperature uniformity may be achieved by covering a bottom portion of the chamber where a pin lift hoop is disposed with a thermally emissive layer.

FIG. 1 is a schematic cross-sectional view of at least one embodiment of an apparatus that may be used to perform embodiments of the present disclosure. The apparatus may be any suitable apparatus for processing substrates, for example, the GEMINI ALD chamber or the Centura® ALD chamber, both available from Applied Materials, Inc., of Santa Clara, Calif. In addition, the inventive embodiments described herein may be used with any process chamber that is sensitive to temperature, including, but not limited to other types of etch chambers, physical vapor deposition chambers, rapid thermal processing chambers, and the like.

The apparatus of FIG. 1 is generally a process chamber 100 having a chamber body 106 and a chamber lid 170 disposed on an upper surface 110 of the chamber body 106 to define an interior volume 134. A substrate support 112 disposed in the interior volume 134 supports the substrate 120 on a substrate receiving surface 114. The process chamber 100 may include a lower liner/shield 168 disposed in a lower portion of the process chamber 100, and an upper line/shield 166 disposed in about a substrate and an upper portion of the substrate support (or pedestal) 112 when the substrate support 112 is in the raised processing position. In some embodiments, the substrate support 112 includes a vacuum chuck, an electrostatic chuck, or a clamp ring for securing the substrate 120 to the substrate support 112. The substrate support 112 is mounted to a lift motor 128 to raise or lower the substrate support 112 and a substrate 120 disposed on the substrate support 112. A slit valve opening 108 formed in a wall 104 of the chamber body 106 facilitates entry and egress of a substrate into and out of the process chamber 100. The dimensions of the slit valve opening 108 may vary depending upon the size of the substrate to be processed in the process chamber 100.

Figure 2:
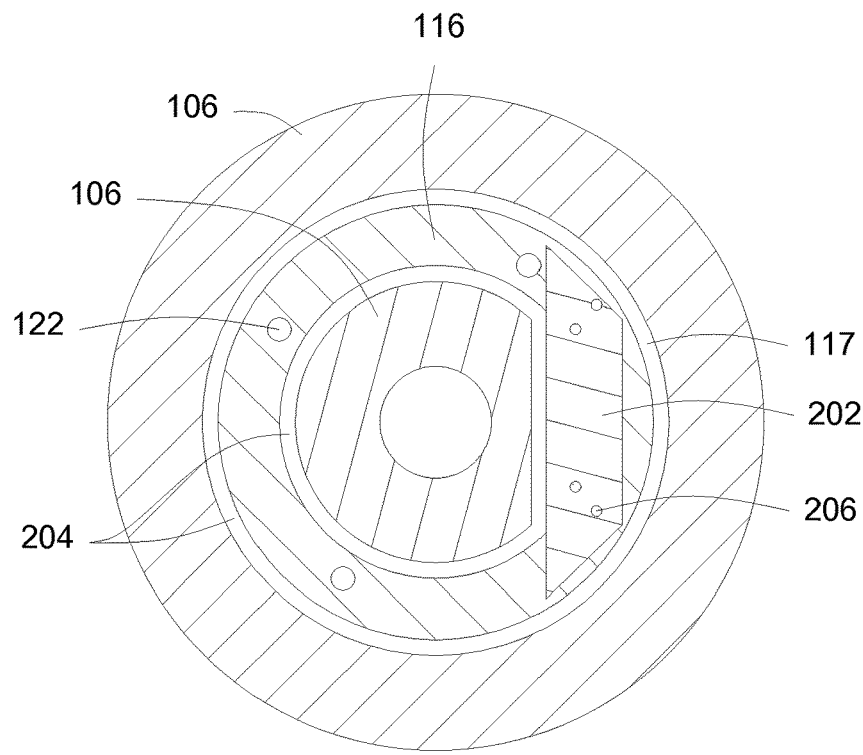
FIG. 2 depicts a cross-sectional top view of a bottom portion of a process chamber in accordance with some embodiments of the present disclosure.

In some embodiments, a pin lift mechanism is mounted in the process chamber 100 in a pin lift mechanism opening formed in the bottom portion of the process chamber 100. The pin lift mechanism may be a pin lift hoop 116 coupled to a lift motor 118 and disposed in a pin lift hoop opening 117. FIG. 2 depicts a cross-sectional top view of the pin lift hoop 116 disposed in the pin lift hoop opening 117. The pin lift hoop 116 may be retained by hoop clamp 202 via hoop clamp fasteners 206. Gaps 204 may be formed between the pin lift hoop 116 and sides of the chamber body 106 in the pin lift hoop opening 117. The pin lift hoop 116 raises or lowers pins 122 movably disposed through pin openings 113 in the substrate support 112. The pins 122 raise or lower the substrate 120 over the surface of the substrate support 112. In some embodiments, the dimensions of the gaps 204 may be about 0.125 inches to about 0.5 inches wide. In some embodiments, the width of the pin lift hoop opening may be about 1 inch to about 1.75 inches wide.

In operation, the substrate support 112 is heated to increase the temperature of the substrate 120 disposed on the substrate support 112. For example, the substrate support 112 may be heated using an embedded heating element, such as a resistive heater or may be heated using radiant heat, such as heating lamps disposed above the substrate support 112. A purge ring 124 is disposed on the substrate support 112 to define a purge channel which provides a purge gas to a peripheral portion of the substrate 120 to prevent deposition on the substrate support 112 during processing. The substrate support 112 may be fabricated from metallic materials, such as, for example, aluminum, or nonmetallic materials, such as ceramics and the like.

In some embodiments, the substrate support 112 may be a ceramic heater which having a thin thickness for retaining and heating a substrate 120 disposed on the substrate support 112. The inventors have observed that the thin heater thickness on ceramic heaters/substrate supports is very sensitive to environmental conditions that may affect the heater temperature. For example, the area of the substrate support 112 located directly over the circular pin lift hoop opening 117, over gaps 204, or over the hoop clamp 202, may have different temperatures as compared to the rest of the substrate support heater surface. Thus, the inventors have proposed including an apparatus in the process chamber 100 to improve substrate temperature uniformity. Specifically, the process chamber 100 may include a cover plate 150 disposed over and covering a bottom portion of the process chamber 100 (as shown in FIGS. 1, 3, 4 and 5) to improve substrate temperature uniformity in a substrate processing chamber, as described in more detail below. The cover plate 150 includes a thermally emissive layer to reflect heat radiated by the substrate support 112 back towards the substrate support to improve substrate temperature uniformity. In order to fine tune the thermal profile of the cover plate, a thermal emissivity of the thermally emissive layer varies across the thermally emissive layer.

Figure 3:
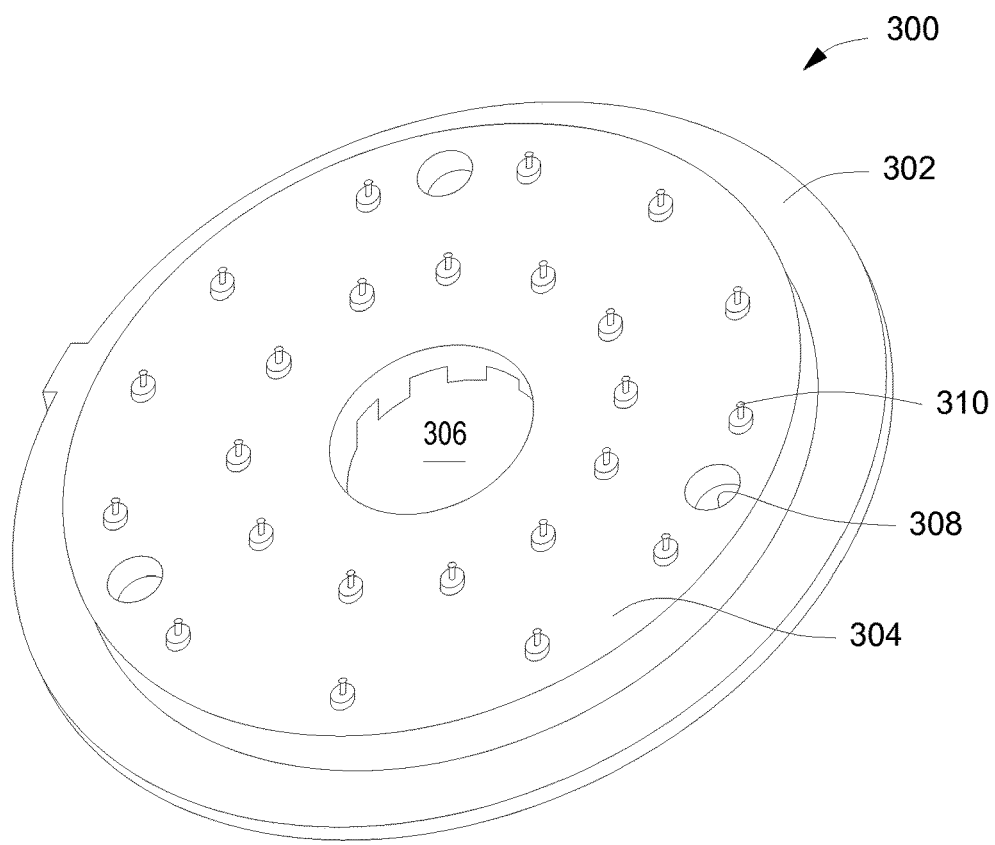
FIG. 3 depicts an isometric view of a cover plate in accordance with some embodiments of the present disclosure.
Figure 4:
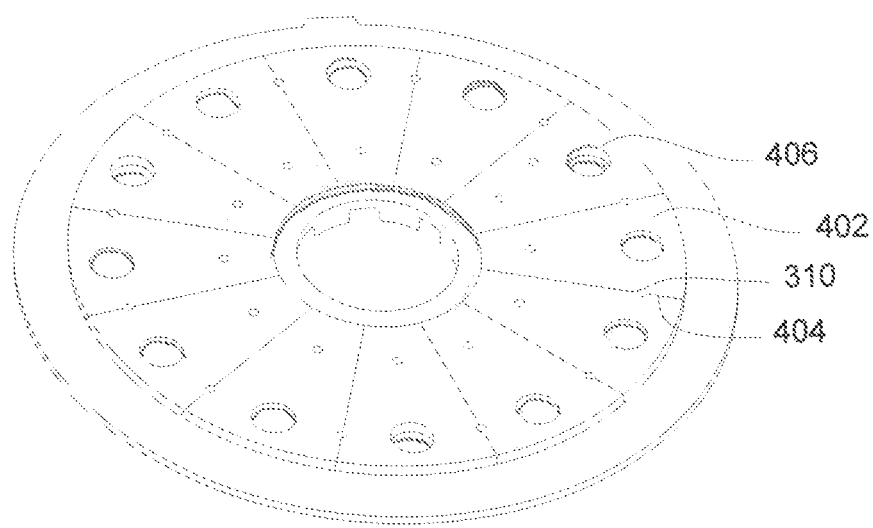
FIG. 4 depicts an isometric view of a plurality of thermally emissive elements disposed on a cover plate in accordance with some embodiments of the present disclosure.

FIGS. 3 and 4 are top views of an exemplary cover plate 300 having a thermally emissive layer formed of at least one thermally emissive element according to some embodiments of the present disclosure. The cover plate 300 may be formed of any process compatible material. In some embodiments, the cover plate 300 may be formed of aluminum. The cover plate 300 includes an outer portion 302 to be coupled to a floor of the process chamber 100 and a raised inner portion 304 to cover the above-noted pin lift hoop opening 117, gaps 204, and hoop clamp 202. In some embodiments, the cover plate 150 may have a uniform thickness across the entire diameter (i.e., a flat disk). The raised inner portion 304 includes a central opening 306 to accommodate a shaft of the substrate support 112 and a plurality of lift pin holes 308 through which the pins 122 extend. In some embodiments, the raised inner portion 304 may include a plurality of features 310 to engage a plurality of corresponding features 404 in a plurality of thermally emissive elements 402 (shown in FIG. 4). In some embodiments, the plurality of features 310 may be protrusions (FIG. 3) and the plurality of corresponding features 404 may be holes (FIG. 4). However, the plurality of thermally emissive elements 402 may be removably coupled to the cover plate 300 in any manner.

Although FIG. 4 illustrates a plurality of thermally emissive elements 402, the thermally emissive layer may consist of any number of thermally emissive elements 402. The plurality of thermally emissive elements may all have the same or different thermal emissivities. As a result, the thermal profile of the thermally emissive layer may advantageously be fine-tuned for each process. Each of the plurality of thermally emissive elements 402 includes a hole 406 that is sized similarly to the lift pin holes 308 to allow the placement of a given thermally emissive element 402 anywhere on the cover plate 300, including on an area having one of the lift pin holes 308. The thermally emissive elements 402 may be formed of any process compatible material whose thermal emissivity can be modulated by changing the surface properties of the thermally emissive element 402. For example, the thermally emissive elements may be polished or bead-blasted to change the surface properties, and thus the thermal emissivity, of the thermally emissive element 402. In some embodiments, the thermally emissive elements 402 may be formed of one of aluminum or alumina. Although in FIG. 4 the thermally emissive elements 402 are depicted as triangular slices, the thermally emissive elements 402 may have any shape necessary to achieve a desired thermal profile.

Figure 5:
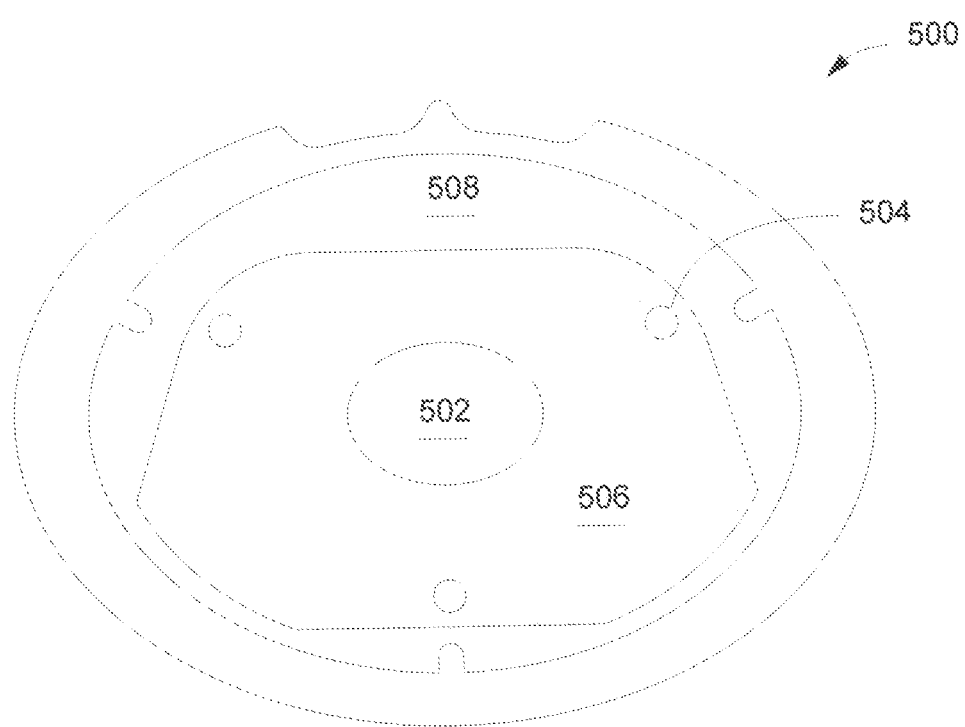
FIG. 5 depicts a top view of a cover plate in accordance with some embodiments of the present disclosure.

FIG. 5 depicts an exemplary cover plate 500 having a thermally emissive layer according to some embodiments of the present disclosure. The cover plate 500 includes a central opening 502 to accommodate the shaft of the substrate support 112 and a plurality of lift pin holes 504 through which the pins 122 extend. In some embodiments, the thermally emissive layer of the cover plate 500 includes a first portion 506 having a first surface finish and a second portion 508 having a second surface finish. For example, the first portion may be bead blasted and have a surface roughness between about 0.2 and about 0.4 and the second portion may be polished and have a surface roughness less than about 0.1. Because the first and second portions 506, 508 have different surface finishes, the respective thermal emissivities of the first and second portions 506, 508 are also different. However, in some embodiments, the first and second portions 506, 508 may have the same thermal emissivity.

Referring back to FIG. 1, an exhaust system 131 is in communication with a pumping channel 132 to evacuate any undesirable gases from the process chamber 100. The exhaust system 131 also helps in maintaining a pressure or a pressure range inside the process chamber 100.

The showerhead 182 (e.g., a gas inlet) may be coupled to a gas delivery system 180 for providing one or more process precursors, process gases, carrier gases and/or purge gases to the interior volume 134 of the process chamber 100 for carrying out processes in the process chamber. For example, in some embodiments, the process chamber 100 may be configured for thermal CVD processes such as the deposition of, in a non-limiting example, tungsten or tungsten-containing materials. Alternatively or in combination, other gas inlets may be provided to introduce and distribute process gases into the process chamber 100, such as nozzles or inlets disposed about the process chamber 100, in the ceiling of the process chamber, and/or within the process chamber about the substrate 120, or the like. In some embodiments, for example, such as where a solid or liquid precursor is utilized, the gas delivery system 180 may also comprise one or more ampoules. In such embodiments, the one or more ampoules may be configured to allow the solid or liquid precursor to be contained and sublime into gaseous form for delivery into the process chamber 100.

A controller 140, such as a programmed personal computer, work station computer, or the like is coupled to the process chamber 100. Illustratively, the controller 140 comprises a central processing unit (CPU) 142, support circuitry 144, and a memory 146 containing associated control software 148. The controller 140 controls the operating conditions of processes performed in the process chamber. For example, the controller 140 may be configured to control the flow of various precursor gases and purge gases from the gas delivery system 180 to the process chamber 100 during different stages of the deposition cycle.

Elements of the above-described embodiments may be combined in various ways to advantageously provide combinations of benefits provided by the different elements. For example, in some embodiments, a cover plate having predetermined surface finish with a first thermal emissivity may also include one or more thermally emissive elements having different thermal emissivities coupled to the cover plate. In some embodiments, the cover plate may be coupled to the shaft of the substrate support closer to the substrate receiving surface.

In any of the preceding embodiments, at least a portion of the cover plate may be surface treated to provide a constant emissivity to a backside of a substrate support heater. In any of the preceding embodiments, at least a portion of the upper surface of the cover plate may be coated with a material that provides a constant emissivity to a backside of a substrate support heater.

While the foregoing is directed to embodiments of the present disclosure, other and further embodiments of the disclosure may be devised without departing from the basic scope of the disclosure.

The invention claimed is:

1. A cover plate for a substrate processing chamber, comprising:
a plate having an annular, radially outer portion and a raised inner portion disposed radially inward of the annular, radially outer portion, the raised inner portion having a thermally emissive layer, wherein a thermal emissivity of the thermally emissive layer varies across the thermally emissive layer, wherein the raised inner portion includes a recess on a side of the raised inner portion opposite the thermally emissive layer, and wherein the raised inner portion includes a central opening and a peripheral opening configured to accommodate a lift pin.

2. The cover plate of claim 1, wherein the thermally emissive layer includes one or more thermally emissive elements removably coupled to the raised inner portion.

3. The cover plate of claim 2, wherein the raised inner portion includes a plurality of features, and wherein the one or more thermally emissive elements include a plurality of corresponding features that engage with the plurality of features on the raised inner portion to couple the one or more thermally emissive elements to the raised inner portion.

4. The cover plate of claim 2, wherein the one or more thermally emissive elements have different thermal emissivities.

5. The cover plate of claim 4, wherein the raised inner portion has a substantially planar upper surface.

6. The cover plate of claim 2, wherein the one or more thermally emissive elements are formed of one of aluminum or alumina.

7. The cover plate of claim 1, wherein the thermally emissive layer includes a first portion having a first surface finish and a second portion having a second surface finish.

8. The cover plate of claim 7, wherein the first portion has a surface roughness between about 0.2 and about 0.4, and wherein the second portion has a surface roughness less than about 0.1.

9. The cover plate of claim 8, wherein the first portion is bead-blasted and the second portion is polished.

10. The cover plate of claim 1, further comprising
one or more thermally emissive elements having a plurality of corresponding features to removably couple the one or more thermally emissive elements to the raised inner portion to form the thermally emissive layer about the central opening, wherein portions of the thermally emissive layer have different thermal emissivities.

11. A substrate processing chamber, comprising:
a substrate support having a substrate receiving surface and a central shaft to support the substrate receiving surface;
a cover plate having a central opening disposed about the central shaft and positioned beneath the substrate receiving surface, the cover plate having a thermally emissive layer to reflect heat toward the substrate receiving surface, wherein a thermal emissivity of the thermally emissive layer varies across the thermally emissive layer; and
a pin lift mechanism disposed in a pin lift mechanism opening formed in a bottom portion of the substrate processing chamber and having a pin lift hoop disposed about the central shaft and having a plurality of lift pins, wherein the cover plate is disposed on a substrate processing chamber floor to cover the pin lift mechanism opening.

12. The substrate support of claim 11,
wherein the cover plate is disposed adjacent the pin lift mechanism opening.

13. The substrate support of claim 11, wherein the thermally emissive layer includes one or more thermally emissive elements removably coupled to the cover plate.

14. The cover plate of claim 13, wherein cover plate includes a plurality of features, and wherein the one or more thermally emissive elements include a plurality of corresponding features that engage with the plurality of features on the cover plate to couple the one or more thermally emissive elements to the cover plate.

15. The cover plate of claim 13, wherein the one or more thermally emissive elements have different thermal emissivities.

16. The cover plate of claim 15, wherein the one or more thermally emissive elements have different surface finishes.

17. The cover plate of claim 11, wherein the thermally emissive layer includes a first portion having a first surface finish and a second portion having a second surface finish.

18. The cover plate of claim 17, wherein the first portion has a surface roughness between about 0.2 and about 0.4, and wherein the second portion has a surface roughness less than about 0.1.

19. The cover plate of claim 18, wherein the first portion is bead-blasted and the second portion is polished.

\* \* \* \* \*